US008772741B2

(12) United States Patent
Ninomiya et al.

(10) Patent No.: US 8,772,741 B2
(45) Date of Patent: Jul. 8, 2014

(54) ION IMPLANTATION METHOD AND ION IMPLANTATION APPARATUS

(75) Inventors: Shiro Ninomiya, Tokyo (JP); Akihiro Ochi, Tokyo (JP); Yasuhiko Kimura, Tokyo (JP); Yasuharu Okamoto, Tokyo (JP); Toshio Yumiyama, Tokyo (JP)

(73) Assignee: SEN Corporation, Tokyo (JP)

( * ) Notice: Subject to any disclaimer, the term of this patent is extended or adjusted under 35 U.S.C. 154(b) by 261 days.

(21) Appl. No.: 13/432,936

(22) Filed: Mar. 28, 2012

(65) Prior Publication Data

US 2012/0252194 A1    Oct. 4, 2012

(30) Foreign Application Priority Data

Mar. 28, 2011 (JP) ................... 2011-071056

(51) Int. Cl.
*H01J 37/317* (2006.01)
(52) U.S. Cl.
CPC ......... *H01J 37/3172* (2013.01); *H01J 37/3171* (2013.01); *H01J 2237/31701* (2013.01); *H01J 2237/31706* (2013.01)
USPC .................................................. 250/492.21
(58) Field of Classification Search
CPC .............. H01J 37/3171; H01J 37/3172; H01J 37/31701
USPC .................................................. 250/492.21
See application file for complete search history.

(56) References Cited

U.S. PATENT DOCUMENTS 4,922,106 A * 5/1990 Berrian et al. ............. 250/492.2
4,980,562 A * 12/1990 Berrian et al. ............. 250/492.2
8,017,922 B2 * 9/2011 Matsumoto et al. ...... 250/492.21
8,368,036 B2 * 2/2013 Hino ......................... 250/492.21
2002/0175297 A1 * 11/2002 Scheuer et al. ........... 250/492.21
2008/0067434 A1   3/2008 Walther et al.

FOREIGN PATENT DOCUMENTS

| JP | 5-6665 U | 1/1993 |
| JP | 2000-39478 A | 2/2000 |
| JP | 2003-86530 A | 3/2003 |
| JP | 2005-235682 A | 9/2005 |
| JP | 2005-328048 A | 11/2005 |
| JP | 2006-156246 A | 6/2006 |
| JP | 2006-203007 A | 8/2006 |
| JP | 2010-118235 A | 5/2010 |

OTHER PUBLICATIONS

Japanese Office Action dated Mar. 5, 2014.

* cited by examiner

*Primary Examiner* — Jack Berman
(74) *Attorney, Agent, or Firm* — Arent Fox LLP (57) ABSTRACT

An ion implantation method includes reciprocally scanning an ion beam, mechanically scanning a wafer in a direction perpendicular to a beam scanning direction, and implanting ions into the wafer. The wafer is divided into a plurality of implantation regions, a beam scanning speed in the beam scanning direction is set to be varied for each of the implantation regions, an ion implantation amount distribution for each of the implantation regions is controlled by changing and controlling the beam scanning speed, and the ion implantation amount for each of the implantation regions is controlled and a beam scanning frequency and a beam scanning amplitude in the control of the beam scanning speed for each of the implantation regions is made to be constant by setting a wafer mechanical scanning speed and controlling the wafer mechanical scanning speed for each of the implantation regions.

15 Claims, 10 Drawing Sheets

ION IMPLANTATION METHOD AND ION IMPLANTATION APPARATUS

This application is based upon and claims the benefit of priority from Japanese patent application No. 2011-071056, filed on Mar. 28, 2011, the disclosure of which is incorporated herein in its entirety by reference.

BACKGROUND

1. Technical Field

The present invention relates to ion implantation, and more particularly to an ion implantation amount control of an ion implantation apparatus.

2. Description of the Related Art

In semiconductor manufacturing processes, a process for implanting ions into a semiconductor wafer is performed in a standard procedure for the purpose of varying conductivity, varying a crystalline structure of the wafer, or the like. An apparatus used in this process is called an ion implantation apparatus, which has a function of generating ions using an ion source, and then forming an accelerated ion beam, and a function of irradiating the entire surface of the semiconductor wafer with the ion beam, through beam scanning, wafer mechanical scanning, or a combination thereof.

In the semiconductor manufacturing processes, in order to create semiconductor chips having the same performance across the entire surface of the wafer, typically, it is necessary to form a uniform condition in the wafer surface. In the ion implantation process, typically, the ion implantation apparatus is controlled such that an ion implantation amount implanted over the entire region of the wafer is made to be uniform.

SUMMARY

According to an embodiment of the present invention, there is provided an ion implantation method including reciprocally scanning an ion beam; mechanically scanning a wafer in a direction perpendicular to a beam scanning direction; and implanting ions into the wafer, wherein the wafer is divided into a plurality of implantation regions in the wafer surface in a wafer mechanical scanning direction, a beam scanning speed in the beam scanning direction can be set to be varied for each of the implantation regions, an ion implantation amount distribution for each of the implantation regions is controlled by changing and controlling the beam scanning speed on the basis of a speed pattern calculated through variable setting of the beam scanning speed corresponding to the ion implantation amount distribution for each of the implantation regions, and the ion implantation amount for each of the implantation regions is controlled and a beam scanning frequency and a beam scanning amplitude in the control of the beam scanning speed for each of the implantation regions are made to be constant by setting a wafer mechanical scanning speed so as to correspond to each of the implantation regions and controlling the wafer mechanical scanning speed for each of the implantation regions.

According to another embodiment of the present invention, there is provided an ion implantation apparatus which reciprocally scans an ion beam, mechanically scans a wafer in a direction perpendicular to a beam scanning direction, and implants ions into the wafer, including a controller that fixes both a beam scanning frequency and a beam scanning amplitude and realizes desired ion implantation amount distribution and ion implantation amount for each of the implantation regions in a case where the wafer is divided into the plurality of implantation regions in a mechanical scanning direction, a beam scanning speed in the beam scanning direction is set to be varied for each of the implantation regions, and, on the basis thereof, an ion implantation amount in the wafer is controlled, in order to correct non-uniformity in the wafer surface in other semiconductor manufacturing processes. Here, the controller controls an ion implantation amount distribution for each of the implantation regions by changing and controlling the beam scanning speed on the basis of a speed pattern calculated through variable setting of the beam scanning speed corresponding to the ion implantation amount distribution for each of the implantation regions, and controls the ion implantation amount for each of the implantation regions and makes a beam scanning frequency and a beam scanning amplitude in the control of the beam scanning speed for each of the implantation regions constant by setting a wafer mechanical scanning speed so as to correspond to each of the implantation regions and controlling the wafer mechanical scanning speed for each of the implantation regions.

DESCRIPTION OF THE PREFERRED EMBODIMENTS

In some semiconductor manufacturing processes, it is difficult to make a uniform condition in the wafer surface in principle. Particularly, in recent years, miniaturization of the semiconductor chip has rapidly progressed, and as their difficulty therein has increased, the extent of non-uniform extent also increased. If a uniform condition is formed in the wafer surface in other processes under such conditions, as a resultant, semiconductor chips having the same performance in the entire wafer surface cannot be created. For example, in the ion implantation process, when a typical ion implantation is performed such that an ion implantation amount in the surface is uniform, electrical characteristics of resultant semiconductor chips are not the same as each other, and thus semiconductor chips having the same performance cannot be created.

Therefore, in a case where a uniform condition cannot be formed in the wafer surface in the other semiconductor manufacturing processes, in order to handle the two-dimensional non-uniformity in the wafer surface, a non-uniform two-dimensional ion implantation amount in-surface (or in-plane) distribution may be intentionally created in the process of irradiating the entire wafer with an ion beam using the ion implantation apparatus, and the non-uniformity in the wafer surface may be corrected in the other semiconductor manufacturing processes. Here, even in a case of creating such an intentional non-uniform two-dimensional ion implantation amount in-surface distribution, only an ion implantation amount in-surface distribution having no influence on other functions in the ion implantation process may be changed. Further, needless to say, in a case where a uniform condition cannot be formed in the wafer surface in the other semiconductor manufacturing processes, the type of in-surface non-uniformity pattern that occurs in the wafer surface is also important.

Here, there are several types of ion implantation apparatus. For example, in an ion implantation apparatus of a type of fixing a wafer and scanning an ion beam in a two-dimensional manner, an ion implantation amount can be relatively easily changed. However, in recent years, since the wafer radius has been larger, it is very difficult to uniformly scan the ion beam in the two-dimensional surface, and thus this type of ion implantation apparatus is not used.

The present invention relates to an ion implantation apparatus which reciprocally scans an ion beam, mechanically scans a wafer in a direction which is substantially perpendicular to the beam scanning direction, and injects ions into the wafer.

In a case of creating an intentional non-uniform two-dimensional ion implantation amount in-surface distribution using such a type of ion implantation apparatus, it is known that the beam scanning frequency thereof has a great influence on ion implantation damage of the wafer. It is also known that the ion implantation damage of the wafer has a great influence on characteristics of final semiconductor products. Therefore, in a case of creating the intentional non-uniform two-dimensional ion implantation amount in-surface distribution in the ion implantation process, beam scanning frequency is required to be same.

Similarly, in the ion implantation apparatus which reciprocally scans an ion beam, mechanically scans a wafer in a direction which is perpendicular to the beam scanning direction, and injects ions into the wafer, in a case of creating the intentional non-uniform two-dimensional ion implantation amount in-surface distribution, the entire width in which the ion beam scanned in the beam scanning direction have (hereinafter, referred to as a beam scanning amplitude) may also be the same as a beam scanning amplitude during the typical uniform ion implantation. Particularly, the ion beam scanned on the area other than the wafer interacts with structures which are structurally necessarily provided at positions other than that of the wafer, and thus causes emission of secondary electrons or secondary ions. As a secondary effect, these secondary electrons or secondary ions cause a charge balance on the wafer, attachment of used separate ion species to the wafer (cross-contamination), and attachment of ion species which are currently in use to the wafer (self-contamination). If the beam scanning amplitude is varied, the charge balance, the cross-contamination, and the self-contamination are also varied. In addition, there is known that these kinds of variations related to recent miniaturized semiconductor products have great influence on the characteristics of the semiconductor products. Therefore, in a case of creating an intentional non-uniform two-dimensional ion implantation amount in-surface distribution in the ion implantation process, the beam scanning amplitude is required to be same.

To summarize, when the intentional non-uniform two-dimensional ion implantation amount in-surface distribution using the ion implantation apparatus, the beam scanning frequency and the beam scanning amplitude thereof are required to be the same as the beam scanning frequency and the beam scanning amplitude when uniform ion implantation is typically performed. That is to say, in this case as well, both the beam scanning frequency and the beam scanning amplitude are required to be fixed at the same time.

In a case of correcting non-uniformity in the wafer surface in other semiconductor manufacturing processes by creating an intentional non-uniform two-dimensional ion implantation amount in-surface distribution using the ion implantation apparatus which reciprocally scans an ion beam, mechanically scans a wafer in a direction which is perpendicular to the beam scanning direction, and injects ions into the wafer, the wafer may be divided into a plurality of implantation regions in the mechanical scanning direction, a scanning speed may be varied for each implantation region, and, accordingly, an ion implantation amount in the wafer surface may be controlled.

As a detailed control method in this case, a method in which an ion beam is reciprocally scanned and a beam scanning speed is varied has been proposed (refer to Japanese Unexamined Patent Application Publication No. 2003-086530 (JP-A-2003-086530).

In the ion implantation method disclosed in JP-A-2003-086530, since only the beam scanning speed is varied, either the beam scanning frequency or the beam scanning amplitude is necessarily varied, and thus both of them are not fixed at the same time, which does not satisfy the above-described conditions necessary when an intentional non-uniform two-dimensional ion implantation amount in-surface distribution is created in the ion implantation process in relation to recent miniaturized semiconductor products.

It is desirable to realize an ion implantation amount control in a wafer while making the beam scanning frequency and the beam scanning amplitude constant, in a case where the wafer is divided into a plurality of implantation regions in the mechanical scanning direction, a beam scanning speed can be set to be varied for each implantation region, and, accordingly, an ion implantation amount in the wafer is controlled, in an apparatus which reciprocally scans an ion beam, mechanically scans the wafer in a direction which is substantially perpendicular to the beam scanning direction, and injects ions into the wafer.

The present invention relates to an ion implantation apparatus which reciprocally scans an ion beam, mechanically scans a wafer in a direction which is perpendicular to the beam scanning direction, and injects ions into the wafer.

The ion implantation method according to the embodiment may be configured as follows.

An ion implantation may be continuously performed for the plurality of implantation regions in the wafer where ion implantation amount distribution and ion implantation amount in the beam scanning direction are set for each of the implantation regions.

The implantation regions may be disposed at a uniform interval or at an arbitrary interval in the mechanical scanning direction of the wafer.

The speed pattern of the beam scanning speed may be separately set so as to correspond to an ion implantation amount distribution for each of the implantation regions.

An integral value of ion beam currents corresponding to a certain number of beam scanning cycles may be measured for each of the implantation regions using a beam measurement device, and the wafer mechanical scanning speed may be controlled on the basis of each speed pattern calculated through variable setting for each of the implantation regions so as to correspond to the measured integral value of ion beam currents.

The wafer mechanical scanning speed may be changed according to the change in the beam scanning speed for each of the implantation regions such that a product of the beam scanning speed and the wafer mechanical scanning speed is made to be constant for each speed pattern.

The speed pattern of the beam scanning speed may be maintained and a reference speed thereof may be multiplied by a proportional constant so as to change the reference speed for each of the implantation regions, thereby making the beam scanning amplitude and the beam scanning frequency constant.

A targeted ion implantation amount distribution may be an arbitrary non-uniform two-dimensional ion implantation amount distribution of a concentric circle shape, an arbitrary non-uniform two-dimensional ion implantation amount distribution of a concentric ring shape, or an arbitrary non-uniform two-dimensional ion implantation amount distribution where the ion implantation amount is partially increased and decreased at specific positions in a plurality of wafer surfaces.

The ion implantation apparatus according to the embodiment may be configured as follows.

The ion implantation apparatus may further include a beam measurement device that measures an integral value of ion beam currents corresponding to a certain number of beam scanning cycles for each of the implantation regions, and the controller may control the wafer mechanical scanning speed for each of the implantation regions so as to correspond to the measured integral value of ion beam currents.

The controller may change the wafer mechanical scanning speed according to the change in the beam scanning speed for each of the implantation regions such that a product of the beam scanning speed and the wafer mechanical scanning speed is made to be constant for each speed pattern.

The controller may maintain the speed pattern of the beam scanning speed and multiply a reference speed thereof by a proportional constant so as to change the reference speed for each of the implantation regions, thereby making the beam scanning amplitude and the beam scanning frequency constant.

Figure 1:
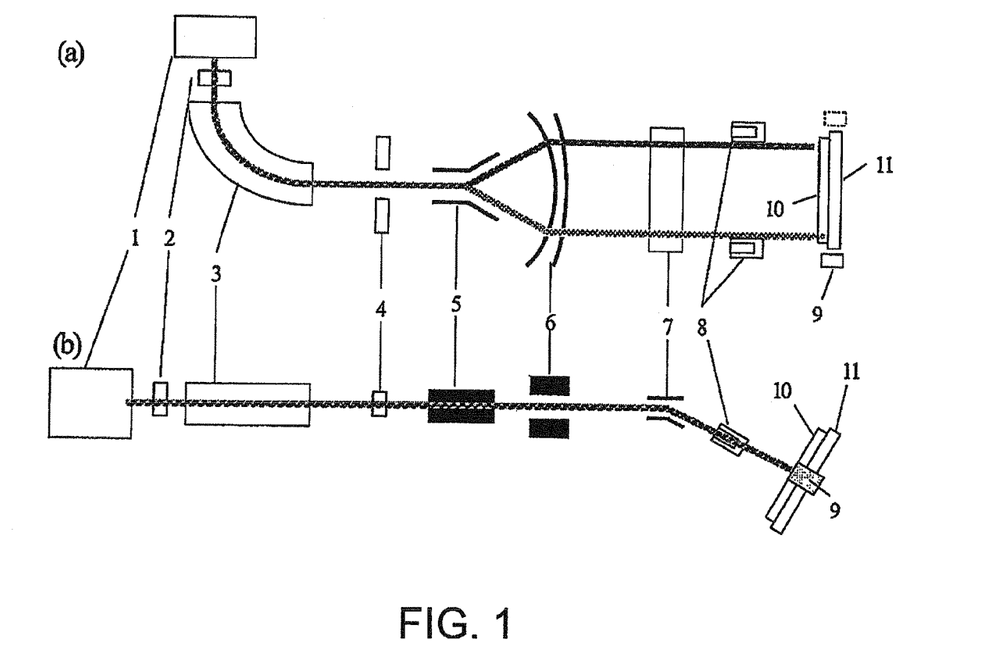
FIG. 1 shows schematic diagrams illustrating an example of the ion implantation apparatus according to a preferred embodiment of the present invention.

Here, a schematic configuration of the ion implantation apparatus according to a preferred embodiment of the present invention will be described with reference to FIG. 1. An upper half of FIG. 1 is a plan view of a schematic configuration of the ion implantation apparatus, and a lower half of FIG. 1 is a side view of the schematic configuration of the ion implantation apparatus.

In the ion implantation apparatus according to the preferred embodiment of the present invention, a mass spectrometry magnet device 3, a mass spectrometry slit 4, a beam scanner 5, and a wafer process chamber (ion implantation chamber) are disposed along a beam line such that an ion beam extracted from an ion source 1 by an extraction electrode 2 pass through the beam line reaching to a wafer 10. In the wafer process chamber, a mechanical scanning device 11 including a mechanism holding the wafer is disposed. The ion beam extracted from the ion source 1 are guided to the wafer 10 on a holder disposed at an ion implantation position of the wafer process chamber along the beam line.

The ion beam becomes parallel to the ion beam travelling direction before entering into the beam scanner 5, by a function of a parallel lens 6 after being reciprocally scanned by the beam scanner 5 in the course of the beam line, and then are guided to the wafer 10.

In the ion implantation apparatus according to the preferred embodiment of the present invention, the wafer is mechanically scanned in a direction perpendicular to the beam scanning direction, thereby injecting ions into the wafer 10. In FIG. 1, uniformity of ion energy is increased by bending the ion beam using an angular energy filter 7, but this is an example, and the angular energy filter 7 may not be used.

In practice, in order to uniformly implant ions into the wafer 10 or to perform an intentional non-uniform two-dimensional ion implantation amount in-surface distribution for the wafer 10, an ion beam is measured using a wafer region beam measurement device 9, and then the wafer 10 is set. In FIG. 1, the wafer region beam measurement device 9 is shown so as to move between the position indicated by the solid line and the position indicated by the dot chain line shown in the figure, but this is an example, and the wafer region beam measurement device 9 may use a non-movable type.

In the wafer process chamber, dose cups 8 are provided so as to measure an ion beam current during the ion implantation. In FIG. 1, the dose cups 8 are provided at two places corresponding to both sides in the beam scanning direction on the front side of the wafer 10, but this is an example, and the dose cups 8 may be provided on the rear side the wafer 10 or may be provided on the plane including the wafer 10 as long as an ion beam current amount during the ion implantation can be measured. In addition, in FIG. 1, the number of the dose cups 8 is two so as to be provided at both sides in the beam scanning direction, but this is an example, and the number thereof may be one, or three or more.

The wafer 10 is set in the mechanical scanning device 11 having the mechanism which holds the wafer 10. Here, the upper half of FIG. 1 shows that the wafer 10 reciprocally moves in the vertical direction perpendicular to the surface of the figure along with the mechanical scanning device 11, and the lower half of FIG. 1 shows that the wafer 10 reciprocally moves in the direction along the surface of the figure along with the mechanical scanning device 11.

Figure 2A:
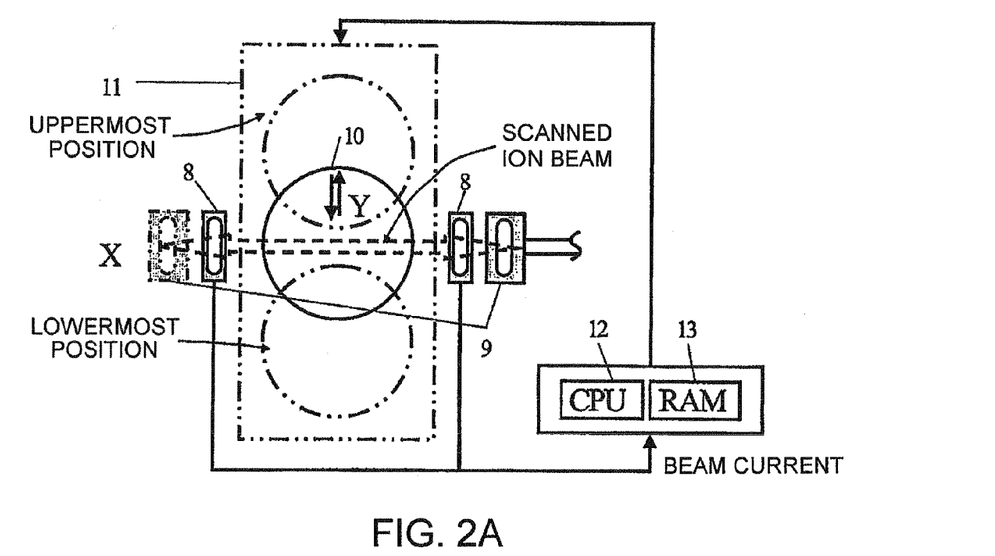
FIGS. 2A and 2B are diagrams illustrating a form when an ion implantation is performed by the ion implantation apparatus shown in FIG. 1.
Figure 2B:
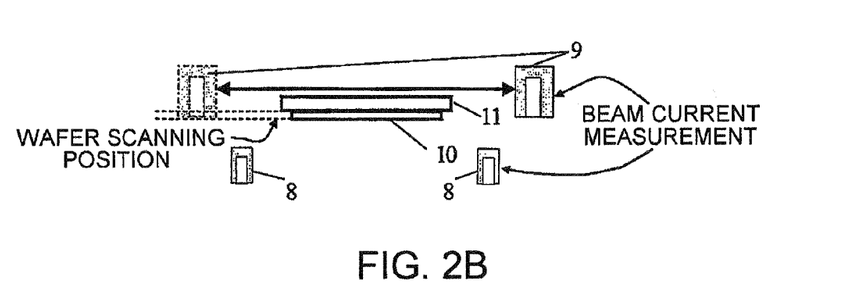

Here, referring to FIGS. 2A and 2B, a form when ion implantation is performed for the wafer 10 will be described in more detail. Particularly, FIG. 2A is a front view when the wafer 10 is viewed from the front side, and FIG. 2B is a plan view when the wafer 10 is viewed from the upper side. As described in FIG. 1, the wafer 10 is set in the mechanical scanning device 11 having the mechanism which holds the wafer 10, and, in FIG. 2A, the wafer 10 reciprocally moves along the surface of the figure along with the mechanical scanning device 11. On the other hand, in FIG. 2B, the wafer 10 reciprocally moves in the vertical direction perpendicular to the surface of the figure. Hereinafter, this direction is referred to as a Y axis direction in some cases.

The mechanical scanning device 11 includes a CPU (Central Processing Unit: controller) 12 changing a scanning speed of the mechanical scanning device 11 as necessary, thereby controlling a scanning speed of the wafer 10 (hereinafter, referred to as a wafer mechanical scanning speed). In addition, the CPU 12 controls a scanning speed in the beam scanning direction (hereinafter, referred to as a beam scanning speed). Further, the mechanical scanning device 11 includes a RAM 13 which stores a movement position in the vertical direction of the wafer 10 and stores a movement position of the wafer 10 as necessary. The RAM 13 further stores a speed pattern of the beam scanning speed. The dose cups 8 measure an ion beam current amount, and output a measurement value thereof to the CPU 12.

In FIG. 2A, the arrow indicated by the broken line denotes a trajectory of the ion beam scanned by the beam scanner 5. In FIG. 2A, the ion beam is reciprocally scanned in the horizontal direction so as to cut across the dose cups 8. Hereinafter, this direction is referred to as an X axis direction in some cases. When the wafer 10 moves in the vertical direction (Y axis direction) as indicated by the two arrows in reverse direction to each other with respect to the ion beam which is reciprocally scanned in the horizontal direction (X axis direction), the ion beam is reciprocally scanned on the entire surface of the wafer 10, and, as a result, ions are implanted into the entire surface of the wafer 10. Specifically, the ions are implanted into the entire surface of the wafer 10 while the wafer 10 moves from the lowermost position to the uppermost position or from the uppermost position to the lowermost position.

Here, with reference to FIGS. 3A, 3B, 4A and 4B, a description will be made of the characteristics of an ion beam current in the ion implantation apparatus according to the preferred embodiment of the present invention, which reciprocally scans the ion beam, mechanically scans the wafer in a direction perpendicular to the beam scanning direction, and injects ions into the wafer. In this type of ion implantation apparatus, an ion implantation amount in the wafer is not controlled by changing intensity of the ion beam generated from the ion source 1.

Figure 11:
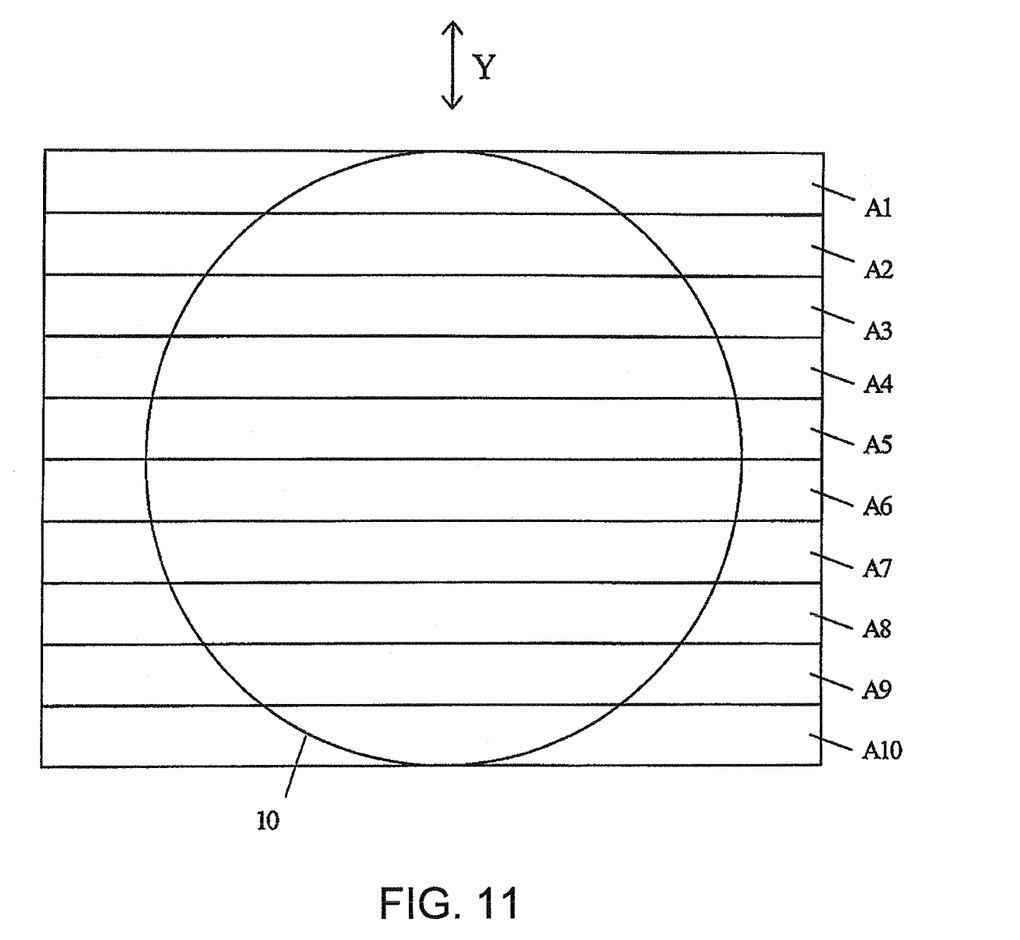
FIG. 11 is a diagram illustrating an example where the wafer is divided in the mechanical scanning direction.

Certain embodiments of the present invention, as shown in FIG. 11, are applied to a case where the wafer 10 is divided into a plurality of implantation regions in the mechanical scanning direction, that is, the Y axis direction, and a beam scanning speed is varied for each implantation region, thereby controlling an ion implantation amount in the wafer, and, in this case, the ion implantation amount in the wafer is controlled by changing the beam scanning speed. In FIG. 11, the wafer 10 is divided into ten stages of A1 to A10, but this is only an example, and the divided range is several stages to several tens of stages. In addition, each implantation region may be set at either a uniform interval or an arbitrary interval in the mechanical scanning direction of the wafer.

Here, the relationships between the beam scanning speed, the beam scanning frequency, and the beam scanning amplitude will be described. The beam scanning frequency is a frequency at which the ion beam is reciprocally scanned. Generally, the beam scanning amplitude is expressed by time integral of the beam scanning speed, and the beam scanning frequency is expressed by a reciprocal of time per scanning cycle. FIGS. 3A, 3B, 4A and 4B schematically show these relationships. In these figures, for better understanding, two beam scanning speeds are indicated as constant values v0 and v1, respectively.

In FIGS. 3A, 3B, 4A and 4B, the beam scanning amplitude is indicated by the area of the rectangular shape which has one side of time per scanning cycle and the other side of beam scanning speed. For example, in FIGS. 3A and 3B, in a case where the time per scanning cycle is t0 and the beam scanning speed is v0, the beam scanning amplitude S0 is indicated by S0=v0×t0. In addition, in a case where the time per scanning cycle is t0 in the same manner, the beam scanning frequency is indicated by 1/t0.

Here, when the beam scanning speed is changed in order to control an ion implantation amount of the wafer, the way in which the beam scanning frequency and the beam scanning amplitude are changed will be exemplified. First, it is assumed that an original beam scanning speed is v0 and time per scanning cycle is t0. At this time, as described above, the beam scanning frequency is indicated by 1/t0, and the beam scanning amplitude S0 is indicated by S0=v0×t0.

Figure 3A:
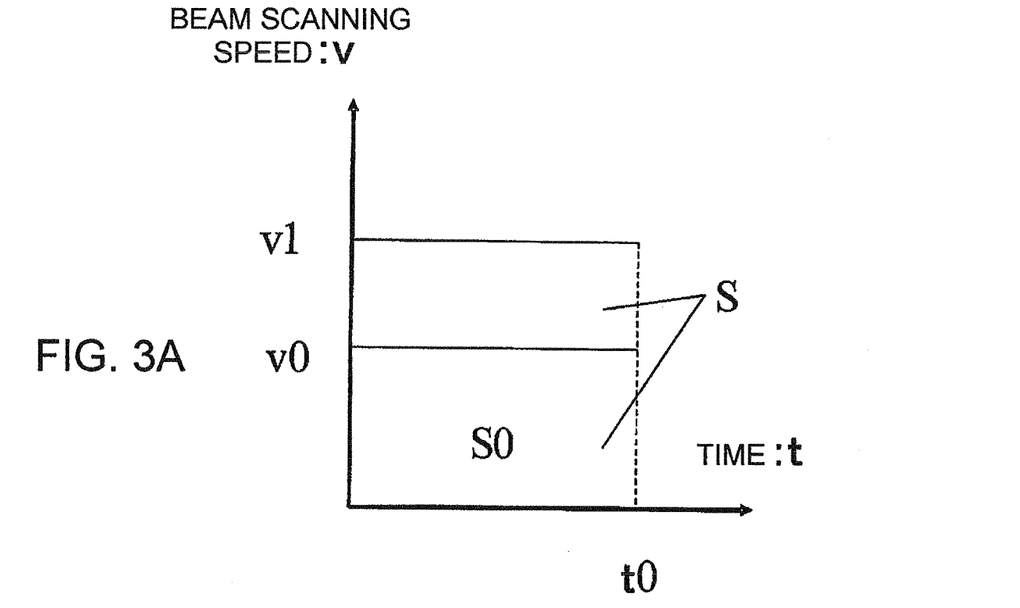
FIGS. 3A and 3B are diagrams illustrating features of an ion beam current in the ion implantation apparatus according to the preferred embodiment of the present invention.
Figure 3B:
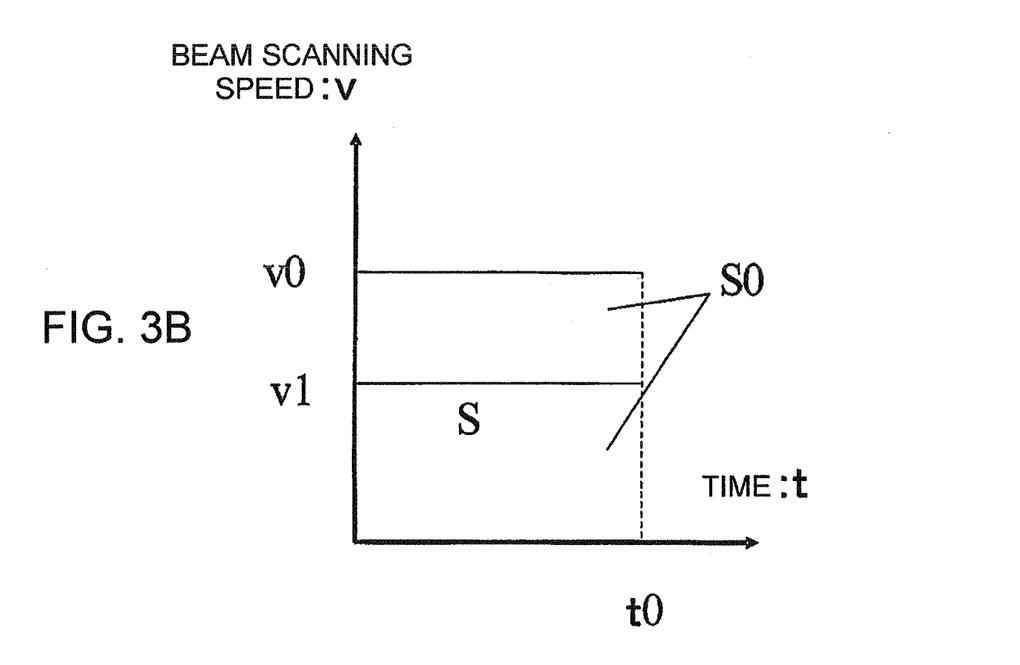

Here, it is assumed that the beam scanning speed is changed to v1. As is clear from FIGS. 3A and 3B, in a case where the time t0 per scanning cycle is not changed in order to make the beam scanning frequency constant, the beam scanning amplitude is indicated by the area of the rectangular shape which has one side of time per scanning cycle and the other side of beam scanning speed, and thus the beam scanning amplitude S is indicated by S=v1×t0. In other words, when the beam scanning speed is changed from v0 to v1, the beam scanning amplitude is changed in a case where the beam scanning frequency is not changed. In addition, FIGS. 3A and 4A show a case of v0<v1, and FIGS. 3B and 4B show a case of v0>v1.

Figure 4A:
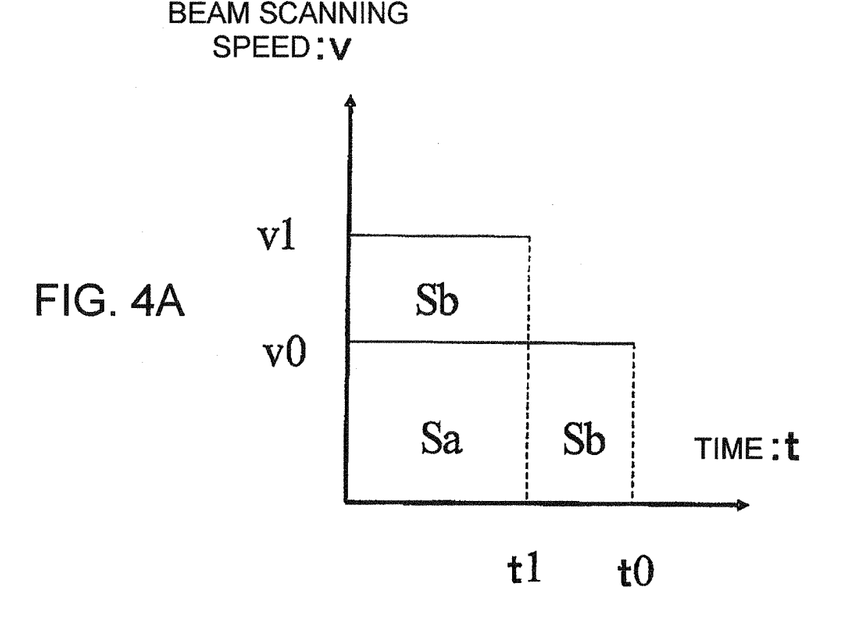
FIGS. 4A and 4B are diagrams illustrating features of an ion beam current in the ion implantation apparatus according to the preferred embodiment of the present invention.
Figure 4B:
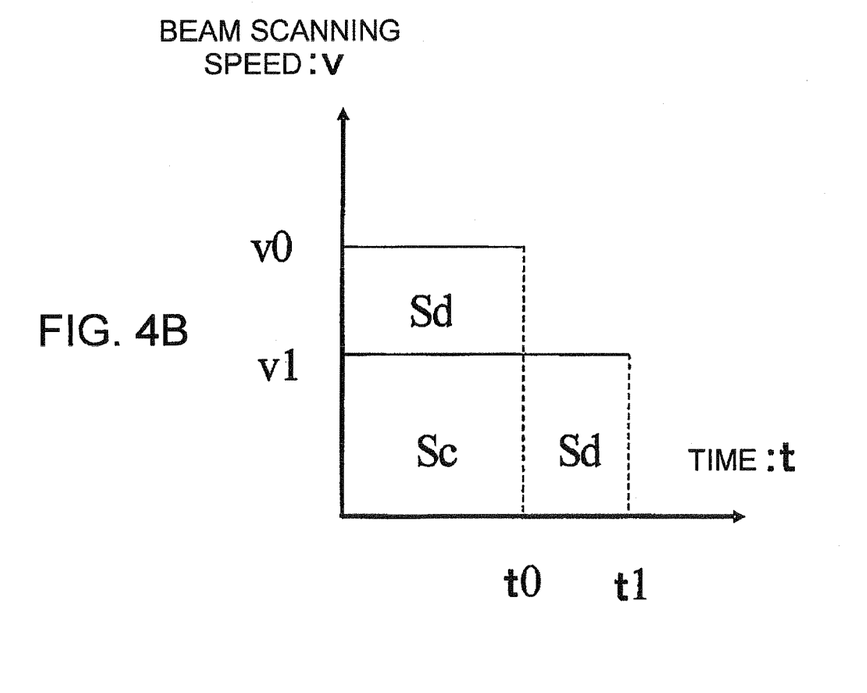

As in FIGS. 4A and 4B, even in a case where the beam scanning speed is changed to v1, the beam scanning amplitude can be made to be constant. That is to say, when the original beam scanning speed is v0, and the time per scanning cycle is t0, the beam scanning amplitude is indicated by (Sa+Sb) in FIG. 4A and (Sc+Sd) in FIG. 4B. Here, if the area of the rectangular shape is controlled so as to make the beam scanning amplitude constant, and thus the time per scanning cycle is changed to t1 at the beam scanning speed v1, the beam scanning amplitude is indicated by (Sa+Sb) (FIG. 4A) or (Sc+Sd) (FIG. 4B). Therefore, the beam scanning amplitude is constant. In this case, however, since the time per scanning cycle is changed from t0 to t1, the beam scanning frequency which is a reciprocal thereof is also changed from 1/t0 to 1/t1, and thus the beam scanning frequency is changed.

This is also the same for a case where, in the apparatus which reciprocally scans the ion beam, mechanically scans the wafer in the perpendicular direction to the beam scanning direction, and injects ions into the wafer, in order to correct non-uniformity in the wafer surface in the other semiconductor manufacturing processes, the wafer is divided into a plurality of implantation regions in the mechanical scanning direction, the beam scanning speed is varied for each implantation region, and, accordingly, an ion implantation amount in the wafer is controlled. Here, this will be described in more detail with reference to FIG. 5.

Figure 5:
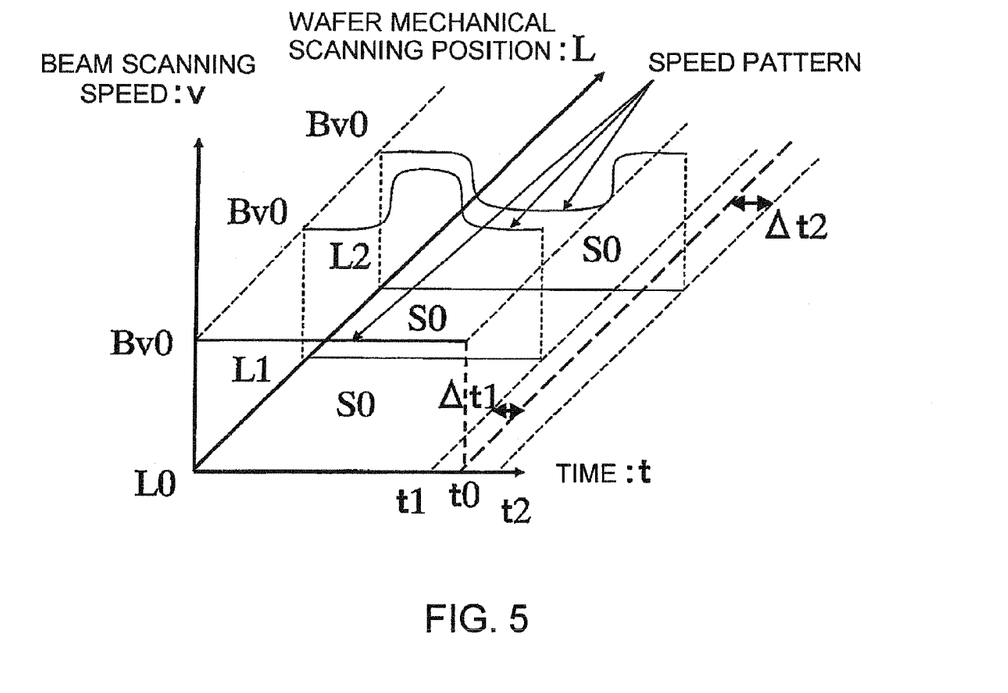
FIG. 5 is a diagram illustrating the beam scanning frequency and the beam scanning amplitude in a case where wafer is divided into a plurality of implantation regions in the mechanical scanning direction and the beam scanning speed is varied for each implantation region.

FIG. 5 shows a relationship between the time per scanning cycle and the beam scanning amplitude in a case where the beam scanning speed is changed at wafer mechanical scanning positions L1 and L2. The wafer mechanical scanning position is a position in the Y axis direction obtained when the wafer is mechanically scanned. Here, although only three regions (positions L0, L1 and L2) are shown, even if the number of regions is increased, the following discussion is the same.

In FIG. 5, a reference speed of the beam scanning speed is indicated by Bv0. The reference speed schematically shows a beam scanning speed in a case where the wafer is implanted at a constant ion implantation amount when the wafer is not divided into regions in the mechanical scanning direction. In the related art at present, in a case where a constant ion implantation amount is obtained at each region even when the wafer is divided into regions in the mechanical scanning direction, a reference speed which is the same as By0 is used as a reference speed of the beam scanning speed in each region. In the intermediate region (the position L1) in FIG. 5, a speed pattern which is controlled such that the beam scanning speed is heightened in the center region of the wafer is shown, and, in the rear region (the position L2) in FIG. 5, a speed pattern which is controlled such that the beam scanning speed is lowered in the central region of the wafer is shown. In the following description, needless to say, a speed pattern of the beam scanning speed is not limited thereto. A speed pattern of the beam scanning speed may be set separately so as to correspond to an ion implantation amount distribution for each of the implantation regions into which the wafer is divided in the mechanical scanning direction.

FIG. 5 shows a case where a control is performed such that the beam scanning amplitude S0 is constant. As described in FIGS. 4A and 4B, in this case, since the time per scanning cycle is changed from t0 to t1 or t2, the beam scanning frequency which is a reciprocal thereof is also changed from 1/t0 to 1/t1 or 1/t2, and thus the beam scanning frequency is changed. FIG. 5 shows a case where t1 is smaller than t0, and t2 is larger than t0.

In addition, in a case where time t0 per scanning cycle is not changed in order to make the beam scanning frequency constant, the beam scanning amplitude is changed for the reason described in FIGS. 3A and 3B. Particularly, in a case where the wafer is divided into a plurality of implantation regions in the mechanical scanning direction, the beam scanning speed is varied for each implantation region, and, accordingly, an ion implantation amount in the wafer is controlled, the change in the beam scanning amplitude indicates that there are cases in which the scanned ion beam does not escape the wafer. In other words, this means that ion implantation cannot be performed on the entire surface of the wafer, and thus a function which is naturally required for the ion implantation apparatus cannot be satisfied.

As described above, in the related art at present, in a case of changing the beam scanning speed, it is not possible to fix (make constant) the beam scanning frequency and the beam scanning amplitude at the same time, which is a condition necessary when an intentional non-uniform two-dimensional ion implantation amount in-surface distribution is created in the ion implantation process. This is an intrinsic problem which normally occurs in a case where the reference speed Bv0 of the beam scanning speed for each region is set to be the same in order to obtain a constant ion implantation amount when the wafer is divided into regions in the mechanical scanning direction.

In the preferred embodiment of the present invention, in the ion implantation apparatus having the ion beam scanning function and the wafer mechanical scanning function, in order to correct non-uniformity in the wafer surface in the other semiconductor manufacturing processes, the wafer is divided into a plurality of implantation regions in the mechanical scanning direction, the beam scanning speed is set to be varied for each implantation region, and, accordingly, an ion implantation amount in the wafer is controlled. In this case, an integral value of ion beam currents corresponding to a certain number of beam scanning cycles is measured with the dose cups 8, the mechanical scanning device 11 is controlled on the basis of the measured integral value of the ion beam currents, the wafer mechanical scanning speed is controlled accordingly, and thereby it is possible to fix both the beam scanning frequency and the beam scanning amplitude and to realize a targeted ion implantation amount distribution and ion implantation amount for each implantation region.

Further, in the preferred embodiment of the present invention, in the ion implantation apparatus having the ion beam scanning function and the wafer mechanical scanning function, in order to correct non-uniformity in the wafer surface in the other semiconductor manufacturing processes, the wafer is divided into a plurality of implantation regions in the mechanical scanning direction, the beam scanning speed is set to be varied for each implantation region, and, accordingly, an ion implantation amount in the wafer is controlled. In this case, the beam scanning speed is multiplied by a proportional constant and the beam scanning amplitude is fixed so as to maintain a target non-uniform ion implantation amount distribution and make the beam scanning amplitude constant in the implantation regions, and thereby it is possible to fix both the beam scanning frequency and the beam scanning amplitude and to realize a targeted ion implantation amount distribution and ion implantation amount for each implantation region.

Here, first, a control of the ion implantation amount performed by the controller, that is, the CPU 12 will be described briefly with reference to FIG. 6. In a case where an ion implantation amount is considered in the ion implantation apparatus, typically, the ion implantation amount may be considered in a one-dimensional manner, that is, only the beam scanning speed is considered, but, accurately, it is required to be treated in a two-dimensional manner. In other words, since the wafer 10 is scanned in the direction perpendicular to the beam scanning direction by the mechanical scanning device 11, a wafer mechanical scanning speed which is controlled by the mechanical scanning device 11 is required to be taken into consideration.

Figure 6:
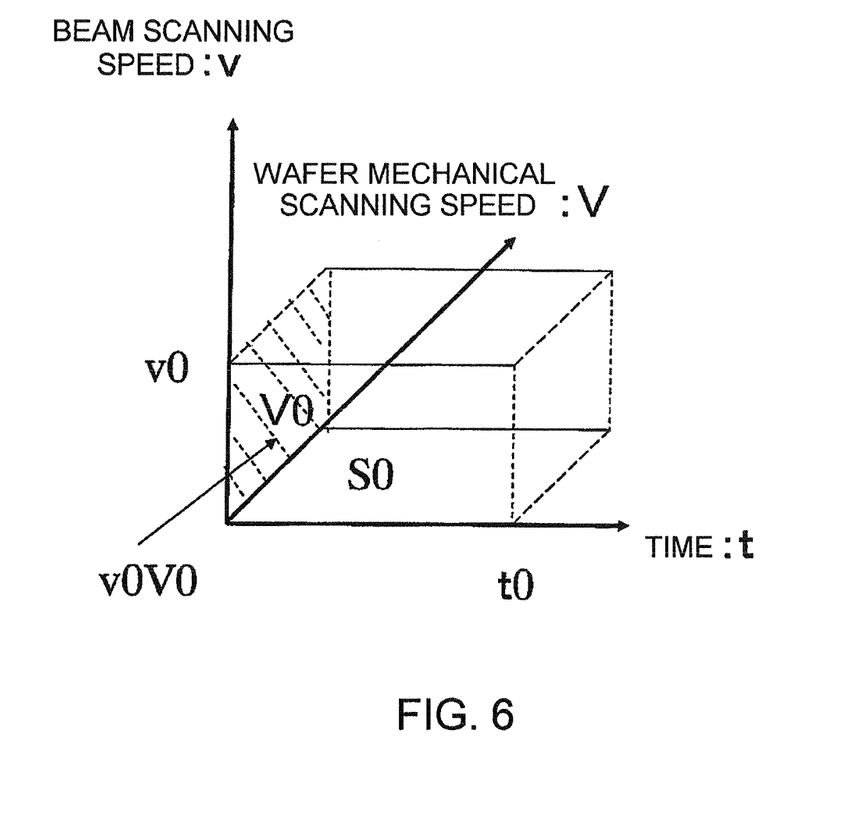
FIG. 6 is a diagram schematically illustrating a control of the ion implantation amount according to the preferred embodiment of the present invention on the basis of a relationship between the beam scanning speed and the wafer mechanical scanning speed.

In addition, in order to examine a beam scanning frequency condition, a beam scanning amplitude condition, and a wafer mechanical scanning speed condition at one time, as shown in FIG. 6, a three-dimensional space which has a side of the time per beam scanning cycle, another side of the beam scanning speed, and a third side of the wafer mechanical scanning speed, is conveniently used. FIG. 6 is a schematic diagram thereof. Here, an ion implantation amount is inversely proportional to a product $v0V0=v0\times V0$ of the beam scanning speed v0 and the wafer mechanical scanning speed V0. In other words, making constant the area $v0V0=v0\times V0$ of the rectangular shape which has one side of the beam scanning speed v0 and the other side of the wafer mechanical scanning speed V0 on a plane formed by the beam scanning speed axis and the wafer mechanical scanning speed axis means making an ion implantation amount constant. In addition, a wafer mechanical scanning distance per beam scanning cycle is indicated by a product $V0\times t0$ of the wafer mechanical scanning speed V0 and the time t0 per beam scanning cycle. Further, the beam scanning amplitude S0 is indicated by $S0=v0\times t0$ as in FIGS. 3A and 3B.

Therefore, in order to obtain a targeted ion implantation amount while fixing both the beam scanning frequency and the beam scanning amplitude, $v0\times V0$ may be controlled while making the time t0 per beam scanning cycle and the beam scanning amplitude S0 (=v0×t0) constant.

Although, in FIG. 6, for simplicity, the same beam scanning speed and the same wafer mechanical scanning speed are used, a result is also the same in a case where the beam scanning speed is set to be varied, and in a case where the wafer mechanical scanning speed is set to be varied.

Here, in the apparatus which reciprocally scans the ion beam, mechanically scans the wafer in the perpendicular direction to the beam scanning direction, and implants ions into the wafer, in a case where the wafer is divided into regions in the mechanical scanning direction and an ion implantation is performed at a constant amount for each region, if the beam scanning frequency and the beam scanning amplitude are made to be constant for each region, the beam scanning speed is automatically made to be the same. Therefore, the concept regarding a control of the ion implantation amount described in FIG. 6 is not clearly shown.

However, in the preferred embodiment of the present invention, in the ion implantation apparatus having the ion beam scanning function and the wafer mechanical scanning function, in order to correct non-uniformity in the wafer surface in the other semiconductor manufacturing processes, a case where the wafer is divided into a plurality of implantation regions in the mechanical scanning direction, the beam scanning speed is set to be varied for each implantation region, and, accordingly, an ion implantation amount in the wafer is controlled, is contradictory to a case where, a speed pattern of the beam scanning speed is required to be used in the implantation regions, and thus if the same ion implantation is performed for a portion of the implantation regions, a reference speed of the beam scanning speed is made to be constant through a single implantation region by making the beam scanning frequency and the beam scanning amplitude constant for each implantation region.

Figure 7:
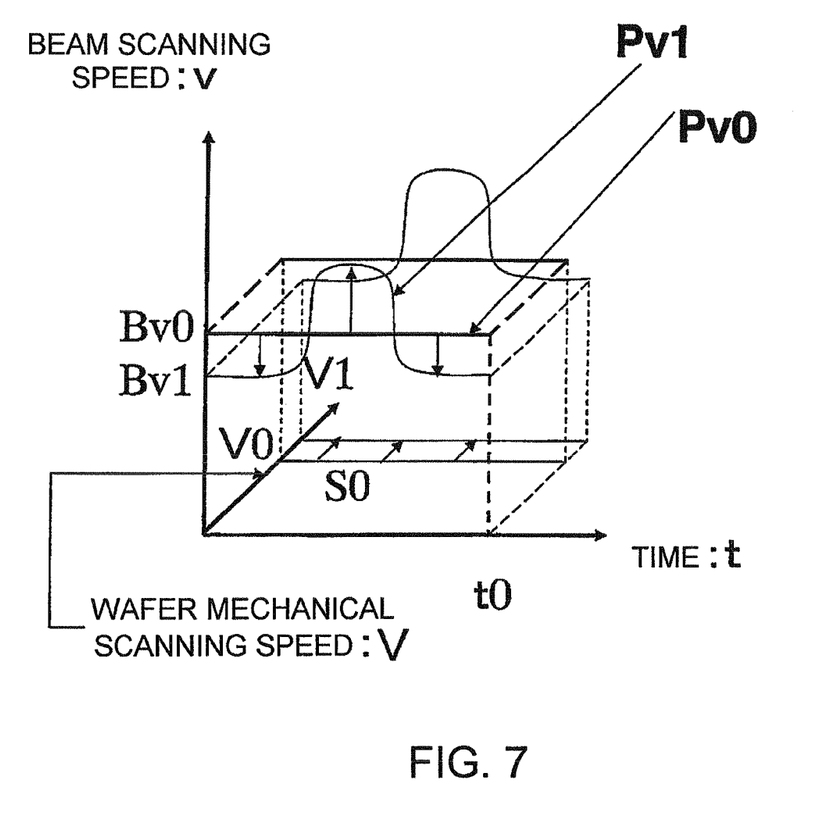
FIG. 7 is a diagram illustrating relationships between the beam scanning frequency, the beam scanning amplitude, and the wafer mechanical scanning speed in association with a speed pattern of the beam scanning speed.

Here, in the ion implantation apparatus according to the preferred embodiment of the present invention, having the ion beam scanning function and the wafer mechanical scanning function, in order to correct non-uniformity in the wafer surface in the other semiconductor manufacturing processes, in a case where the wafer is divided into a plurality of implantation regions in the mechanical scanning direction, the beam scanning speed is set to be varied for each implantation region, and, accordingly, an ion implantation amount in the wafer is controlled, relationships between the beam scanning frequency, the beam scanning amplitude, and the wafer mechanical scanning speed will be described with reference to FIG. 7. FIG. 7 shows that a speed pattern Pv1 is changed from a flat speed pattern Pv0 such that the beam scanning speed is heightened only in the central part of the wafer. Of course, in the following description, a speed pattern of the beam scanning speed is not limited thereto.

Here, it is assumed that the same ion implantation amount intensity as in FIG. 6 is desired to be obtained in parts other than the central part of the wafer in FIG. 7. When reference speeds are set to the same Bv0, as described above, either the beam scanning frequency or the beam scanning amplitude is not fixed.

However, it is not necessary to make the reference speed constant in order to obtain the same ion implantation amount intensity. In other words, as described in FIG. 6, in order to make an ion implantation amount constant, a product v0×V0 of the beam scanning speed v0 and the wafer mechanical scanning speed V0 may be constant, and it is not necessary to make only v0 constant.

Therefore, as shown in FIG. 7, a reference speed in the beam scanning direction is changed from Bv0 (thick solid line) to Bv1 (thin solid line), and, accordingly, the wafer mechanical scanning speed is changed from V0 to V1. Thereby, a product thereof, that is, v0 (beam scanning speed at Bv0)×V0 in FIG. 6, and v1 (beam scanning speed at Bv1)×V1 in FIG. 7 can be made to be constant (v0×V0=v1×V1). Thereby, it is possible to obtain the same ion implantation amount as in FIG. 6 in parts other than the central part of the wafer in FIG. 7.

Here, if v1 (beam scanning speed at Bv1) in FIG. 7 is appropriately selected, the beam scanning amplitude indicated by the area of the plane formed by the axis of the time per beam scanning cycle and the axis of the beam scanning speed can be fixed without changing the time t0 per beam scanning cycle. In other words, it is possible to realize targeted ion implantation amount distribution and ion implantation amount while fixing both the beam scanning frequency and the beam scanning amplitude.

The preferred embodiment of the present invention has been briefly described above, and the preferred embodiment of the present invention will be described in more detail with reference to FIG. 8.

Figure 8:
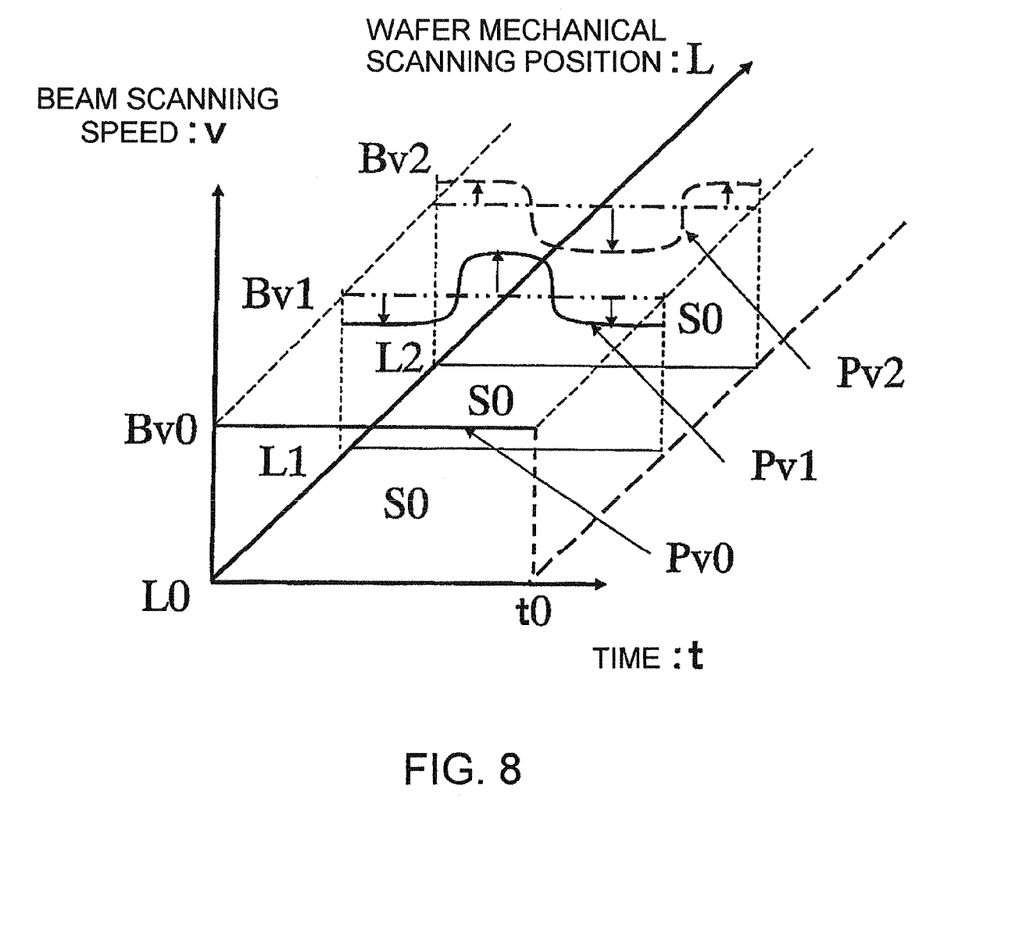
FIG. 8 is a diagram schematically illustrating a control of the ion implantation amount according to the preferred embodiment of the present invention in association with a speed pattern of the beam scanning speed.

FIG. 8 shows a relationship between the time per beam scanning cycle and the beam scanning amplitude in a case where the beam scanning speed is changed at wafer mechanical scanning positions L1 and L2. Here, although the speed patterns Pv0, Pv1 and Pv2 in three regions at the positions L0, L1 and L2 are shown, even if the number of regions is increased, the following discussion is the same.

In the intermediate position L1 in FIG. 8, a speed pattern Pv1 which is controlled such that the beam scanning speed is heightened in the center region of the wafer is shown, and, in the rear position L2 in FIG. 8, a speed pattern Pv2 which is controlled such that the beam scanning speed is lowered in the central region of the wafer is shown. In addition, a case where an ion implantation of the same ion implantation amount is performed for regions other than the central region of the wafer is shown. In the following description, needless to say, a speed pattern of the beam scanning speed is not limited thereto.

In FIG. 8, both the beam scanning frequency and the beam scanning amplitude are fixed, that is, values of t0 and S0 are made to be constant at all times in FIG. 8, and the beam scanning speed is changed at the wafer mechanical scanning positions L1 and L2. Specifically, positions where the beam scanning speed is to be changed are stored in the RAM 13, and the CPU 12 controls the beam scanning speed and the wafer mechanical scanning speed on the basis of a speed pattern of the beam scanning speed which is separately stored in the RAM 13 when the wafer 10 mechanically scanned by the mechanical scanning device 11 arrives at the positions. Needless to say, a speed pattern of the beam scanning speed stored in the RAM 13 is calculated for each implantation region and is stored in advance.

In a case of FIG. 8, in the region at the position L1 on the front side of the figure and the region at the position L2 on the rear side of the figure, when the ion implantation of the same ion implantation amount is performed, the reference speed is changed from Bv0 to Bv1, and from Bv0 to Bv2, respectively. This is because the beam scanning amplitude is fixed, and a changing method is realized through raising (or dropping) (the broken line from the two-dot chain line, or the solid line from the two-dot chain line) by multiplying the reference speed by proportional constants such that the speed patterns of the beam scanning speed separately stored in the RAM 13 and the beam scanning amplitude is fixed.

Further, although not shown in FIG. 8, according to the change in the reference speed, the wafer mechanical scanning speed is changed such that a product of the reference speed of the beam scanning and the wafer mechanical scanning speed is made to be constant. This change is realized by measuring an integral value of ion beam currents corresponding to a certain number of beam scanning cycles using the dose cups 8, and by controlling the wafer mechanical scanning speed using the mechanical scanning device 11 so as to correspond to the measured integral value of the ion beam currents.

The switching of the change is repeatedly performed for each of the divided implantation regions. Thereby, in the apparatus which reciprocally scans the ion beam, mechanically scans the wafer in the perpendicular direction to the beam scanning direction, and implants ions into the wafer, in order to correct non-uniformity in the wafer surface in the other semiconductor manufacturing processes, in a case where the wafer is divided into a plurality of implantation regions in the mechanical scanning direction, the beam scanning speed is set to be varied for each implantation region, and, accordingly, an ion implantation amount in the wafer is controlled, it is possible to fix both the beam scanning frequency and the beam scanning amplitude and to realize a targeted ion implantation amount distribution and ion implantation amount for each implantation region.

Hereinafter, an example where a detailed problem was actually solved according to the preferred embodiment of the present invention will be described.

Figure 9:
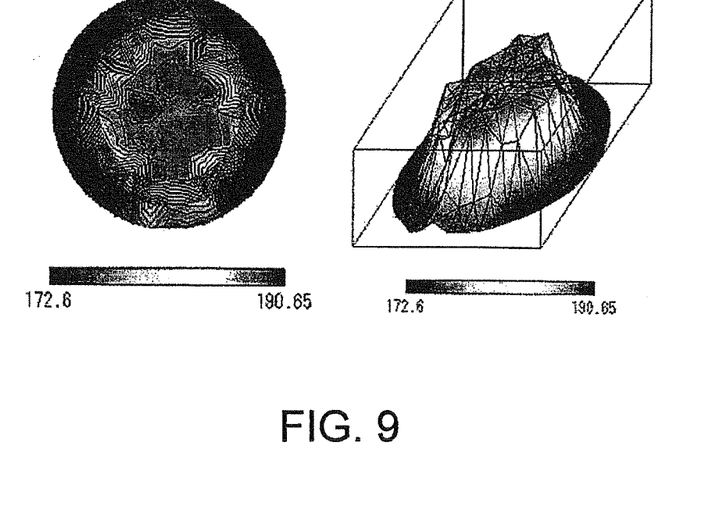
FIG. 9 is a diagram illustrating an example of the intentional non-uniform two-dimensional ion implantation amount distribution in the wafer surface which was obtained in practice according to the preferred embodiment of the present invention.

Referring to FIG. 9, an example of the ion implantation amount in-surface (or in-plane) distribution which was actually obtained according to the preferred embodiment of the present invention is shown. In this example, an intentional non-uniform two-dimensional ion implantation amount distribution of a concentric circle shape was obtained.

Figure 10:
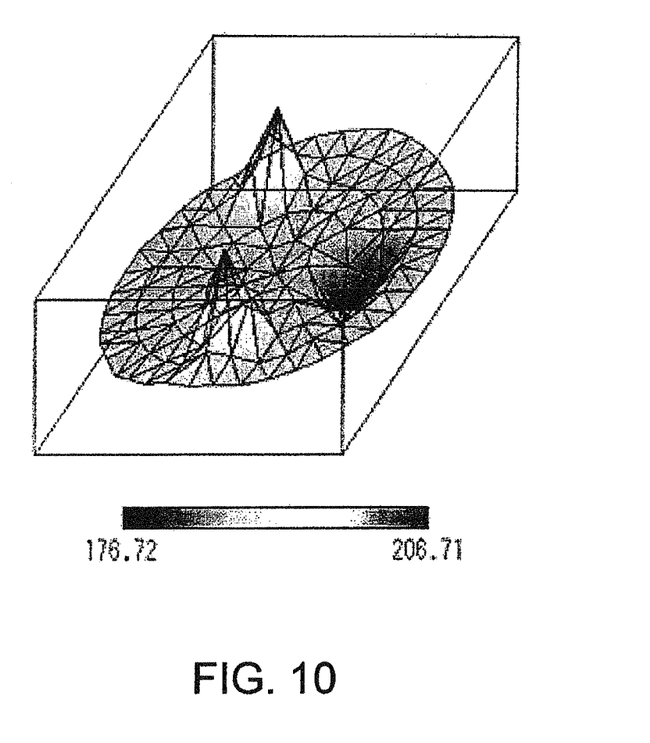
FIG. 10 is a diagram illustrating an example of the intentional non-uniform two-dimensional ion implantation amount distribution in the wafer surface which was obtained in practice according to the preferred embodiment of the present invention.

Referring to FIG. 10, another example of the ion implantation amount in-surface distribution which was actually obtained according to the preferred embodiment of the present invention is shown. In this example, an intentional non-uniform two-dimensional ion implantation amount distribution where an ion implantation amount is partially increased and decreased at specific positions in a plurality of wafer surfaces was obtained.

FIGS. 9 and 10 are only an example, and do not limit the present invention. According to the preferred embodiment of the present invention, it is possible to obtain an intentional non-uniform two-dimensional ion implantation amount in-surface distribution of, for example, a concentric ring shape, and to obtain intentional non-uniform two-dimensional ion implantation amount distributions of various other shapes.

As such, according to the preferred embodiment of the present invention, the reason why various intentional non-uniform two-dimensional ion implantation amount distributions can be obtained is that a speed pattern of the beam scanning speed in the wafer is maintained, the beam scanning frequency is fixed by multiplying the reference speed thereof by proportional constants, an integral value of ion beam currents corresponding to a certain number of beam scanning cycles is measured so as to correspond therewith, the wafer mechanical scanning speed is controlled on the basis of the measured integral value of ion beam currents, and thereby a contradictory, which normally occurs due to it, is removed between the ion implantation amount pattern and the ion implantation amount absolute value through the implantation regions by making the beam scanning frequency and the beam scanning amplitude constant.

As above, according to the preferred embodiment of the present invention, in the apparatus which reciprocally scans the ion beam, mechanically scans the wafer in the perpendicular direction to the beam scanning direction, and implants ions into the wafer, in order to correct non-uniformity in the wafer surface in the other semiconductor manufacturing processes, in a case where the wafer is divided into a plurality of implantation regions in the mechanical scanning direction, the beam scanning speed is set to be varied for each implantation region, and, accordingly, an ion implantation amount in the wafer is controlled, it is possible to fix both the beam scanning frequency and the beam scanning amplitude and to realize targeted ion implantation amount distribution and ion implantation amount for each implantation region.

Although several exemplary embodiments have been described, the description thereof is only an example, and is not intended to limit the present invention.

It should be understood that the present invention is not limited to the above-described embodiments, but may be modified into various forms on the basis of the spirit of the invention. Additionally, the modifications are included in the scope of the invention.

What is claimed is:

1. An ion implantation method comprising:
reciprocally scanning an ion beam;
mechanically scanning a wafer in a direction perpendicular to a beam scanning direction; and
implanting ions into the wafer,
wherein the wafer is divided into a plurality of implantation regions in the wafer surface in a wafer mechanical scanning direction, a beam scanning speed in the beam scanning direction is set to be varied for each of the implantation regions, an ion implantation amount distribution for each of the implantation regions is controlled by changing and controlling the beam scanning speed on the basis of a speed pattern calculated through variable setting of the beam scanning speed corresponding to the ion implantation amount distribution for each of the implantation regions, and the ion implantation amount for each of the implantation regions is controlled and a beam scanning frequency and a beam scanning amplitude in the control of the beam scanning speed for each of the implantation regions are made to be constant by setting a wafer mechanical scanning speed so as to correspond to each of the implantation regions and controlling the wafer mechanical scanning speed for each of the implantation regions.

2. The ion implantation method according to claim 1, wherein an ion implantation is continuously performed for the plurality of implantation regions in the wafer where ion implantation amount distribution and ion implantation amount in the beam scanning direction are set for each of the implantation regions.

3. The ion implantation method according to claim 1, wherein the implantation regions are disposed at a uniform interval in the mechanical scanning direction of the wafer.

4. The ion implantation method according to claim 1, wherein the implantation regions are disposed at an arbitrary interval in the mechanical scanning direction of the wafer.

5. The ion implantation method according to claim 1, wherein the speed pattern of the beam scanning speed is separately set so as to correspond to an ion implantation amount distribution for each of the implantation regions.

6. The ion implantation method according to claim 1, wherein an integral value of ion beam currents corresponding to a certain number of beam scanning cycles is measured for each of the implantation regions using a beam measurement device, and the wafer mechanical scanning speed is controlled on the basis of each speed pattern calculated through variable setting for each of the implantation regions so as to correspond to the measured integral value of ion beam currents.

7. The ion implantation method according to claim 1, wherein the wafer mechanical scanning speed is changed according to the change in the beam scanning speed for each of the implantation regions such that a product of the beam scanning speed and the wafer mechanical scanning speed is made to be constant for each speed pattern.

8. The ion implantation method according to claim 1, wherein the speed pattern of the beam scanning speed is maintained and a reference speed thereof is multiplied by a proportional constant so as to change the reference speed for each of the implantation regions, thereby making the beam scanning amplitude and the beam scanning frequency constant.

9. The ion implantation method according to claim 1, wherein a targeted ion implantation amount distribution is an arbitrary non-uniform two-dimensional ion implantation amount distribution of a concentric circle shape.

10. The ion implantation method according to claim 1, wherein a targeted ion implantation amount distribution is an arbitrary non-uniform two-dimensional ion implantation amount distribution of a concentric ring shape.

11. The ion implantation method according to claim 1, wherein a targeted ion implantation amount distribution is an arbitrary non-uniform two-dimensional ion implantation amount distribution where the ion implantation amount is partially increased and decreased at specific in-surface positions in the wafer.

12. An ion implantation apparatus which reciprocally scans an ion beam, mechanically scans a wafer in a direction perpendicular to a beam scanning direction, and implants ions into the wafer, comprising:
a controller that fixes both a beam scanning frequency and a beam scanning amplitude and realizes desired ion implantation amount distribution and ion implantation amount for each implantation regions in a case where the wafer is divided into a plurality of implantation regions in a mechanical scanning direction, a beam scanning speed in the beam scanning direction is set to be varied for each of the implantation regions, and, on the basis thereof, an ion implantation amount in the wafer is controlled, in order to correct non-uniformity in the wafer surface in other semiconductor manufacturing processes,
wherein the controller controls an ion implantation amount distribution for each of the implantation regions by changing and controlling the beam scanning speed on the basis of a speed pattern calculated through variable setting of the beam scanning speed corresponding to the ion implantation amount distribution for each of the implantation regions, and controls the ion implantation amount for each of the implantation regions and makes a beam scanning frequency and a beam scanning amplitude in the control of the beam scanning speed for each of the implantation regions constant by setting a wafer mechanical scanning speed so as to correspond to each of the implantation regions and controlling the wafer mechanical scanning speed for each of the implantation regions.

13. The ion implantation apparatus according to claim 12, further comprising a beam measurement device that measures an integral value of ion beam currents corresponding to a certain number of beam scanning cycles for each of the implantation regions,
wherein the controller controls the wafer mechanical scanning speed for each of the implantation regions so as to correspond to the measured integral value of ion beam currents.

14. The ion implantation apparatus according to claim 12, wherein the controller changes the wafer mechanical scanning speed according to the change in the beam scanning speed for each of the implantation regions such that a product of the beam scanning speed and the wafer mechanical scanning speed is made to be constant for each speed pattern.

15. The ion implantation apparatus according to claim 12, wherein the controller maintains the speed pattern of the beam scanning speed and multiplies a reference speed thereof by a proportional constant so as to change the reference speed for each of the implantation regions, thereby making the beam scanning amplitude and the beam scanning frequency constant.

* * * * *